(12) United States Patent
Bai et al.

(10) Patent No.: US 9,340,870 B2
(45) Date of Patent: May 17, 2016

(54) MAGNETIC FIELD FLUCTUATION FOR BEAM SMOOTHING

(71) Applicant: Advanced Ion Beam Technology, Inc., Hsin-Chu (TW)

(72) Inventors: Xiao Bai, Fremont, CA (US); Zhimin Wan, Sunnyvale, CA (US); Donald Wayne Berrian, Topsfield, MA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 105 days.

(21) Appl. No.: 13/769,189

(22) Filed: Feb. 15, 2013

(65) Prior Publication Data
US 2014/0212595 A1    Jul. 31, 2014

Related U.S. Application Data

(60) Provisional application No. 61/757,068, filed on Jan. 25, 2013.

(51) Int. Cl.
| C23C 14/00 | (2006.01) |
| C23C 14/48 | (2006.01) |
| H01J 37/147 | (2006.01) |
| H01J 37/317 | (2006.01) |

(52) U.S. Cl.
CPC ............. *C23C 14/48* (2013.01); *H01J 37/1475* (2013.01); *H01J 37/3171* (2013.01); *H01J 2237/1526* (2013.01); *H01J 2237/31703* (2013.01)

(58) Field of Classification Search
CPC ...................................... C23C 14/48
USPC ......................................... 427/523
See application file for complete search history.

(56) References Cited

U.S. PATENT DOCUMENTS

| 5,132,544 A | 7/1992 | Glavish |
| 5,350,926 A * | 9/1994 | White et al. ............. 250/492.21 |
| 5,438,203 A | 8/1995 | Glavish et al. |
| 6,918,351 B2 | 7/2005 | Chen et al. |
| 7,326,941 B2 | 2/2008 | Chen et al. |
| 7,498,590 B2 | 3/2009 | Dzengeleski |
| 7,525,103 B2 | 4/2009 | Purser et al. |
| 7,675,050 B2 | 3/2010 | Chen |
| 7,868,305 B2 | 1/2011 | Gupta et al. |
| 2005/0017202 A1* | 1/2005 | White ...................... 250/492.21 |
| 2009/0189096 A1* | 7/2009 | Chen et al. .............. 250/492.21 |
| 2011/0001059 A1 | 1/2011 | Ray |
| 2011/0121207 A1* | 5/2011 | Brailove .................. 250/492.21 |

* cited by examiner

*Primary Examiner* — Dah-Wei D Yuan
*Assistant Examiner* — Nga Leung V Law
(74) *Attorney, Agent, or Firm* — Morrison & Foerster LLP

(57) ABSTRACT

The time-averaged ion beam profile of an ion beam for implanting ions on a work piece may be smoothed to reduce noise, spikes, peaks, and the like and to improve dosage uniformity. Auxiliary magnetic field devices, such as electromagnets, may be located along an ion beam path and may be driven by periodic signals to generate a fluctuating magnetic field to smooth the ion beam profile (i.e., beam current density profile). The auxiliary magnetic field devices may be positioned outside the width and height of the ion beam, and may generate a non-uniform fluctuating magnetic field that may be strongest near the center of the ion beam where the highest concentration of ions may be positioned. The fluctuating magnetic field may cause the beam profile shape to change continuously, thereby averaging out noise over time.

23 Claims, 10 Drawing Sheets

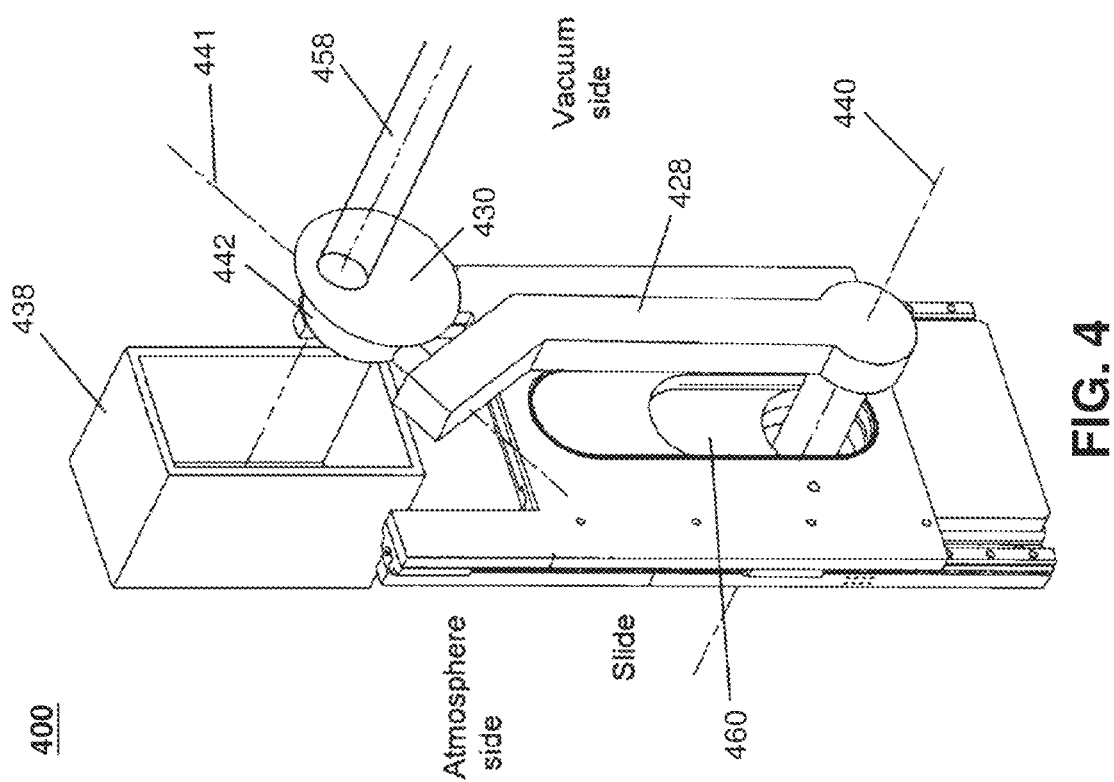

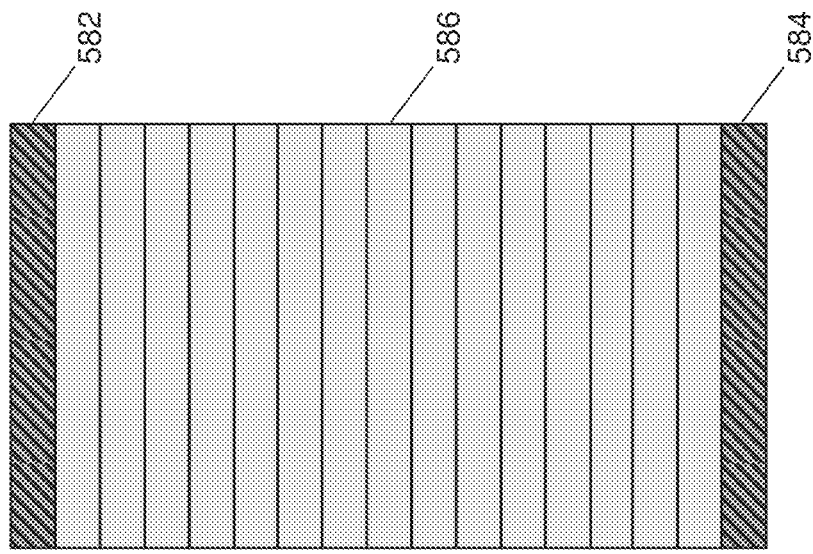
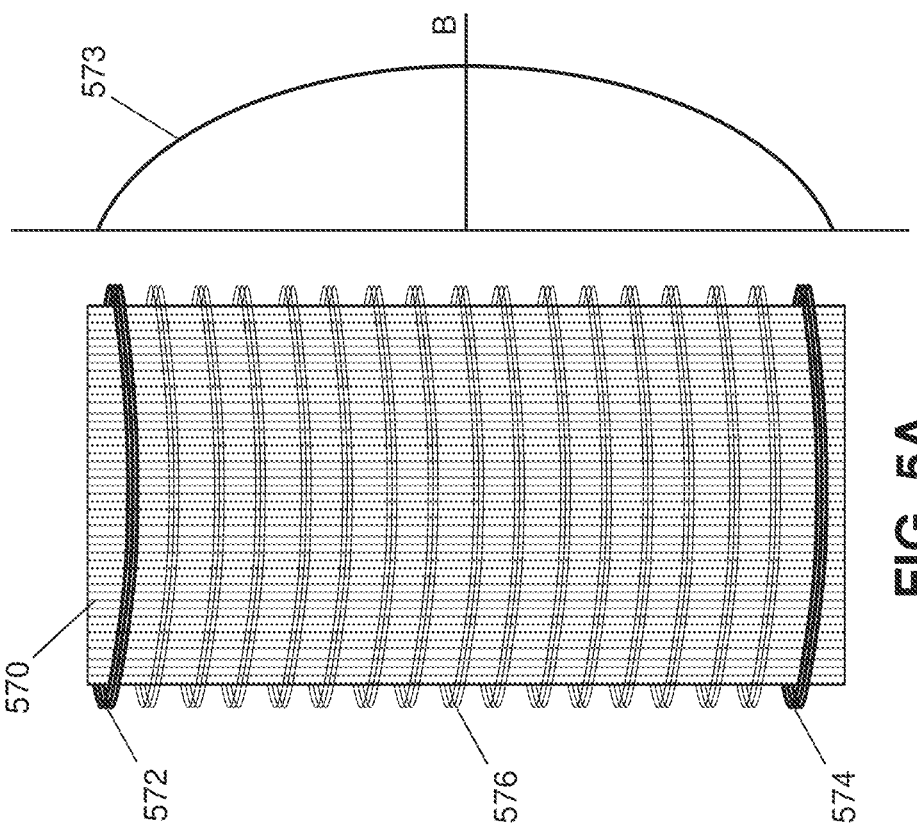
FIG. 5A
FIG. 5B

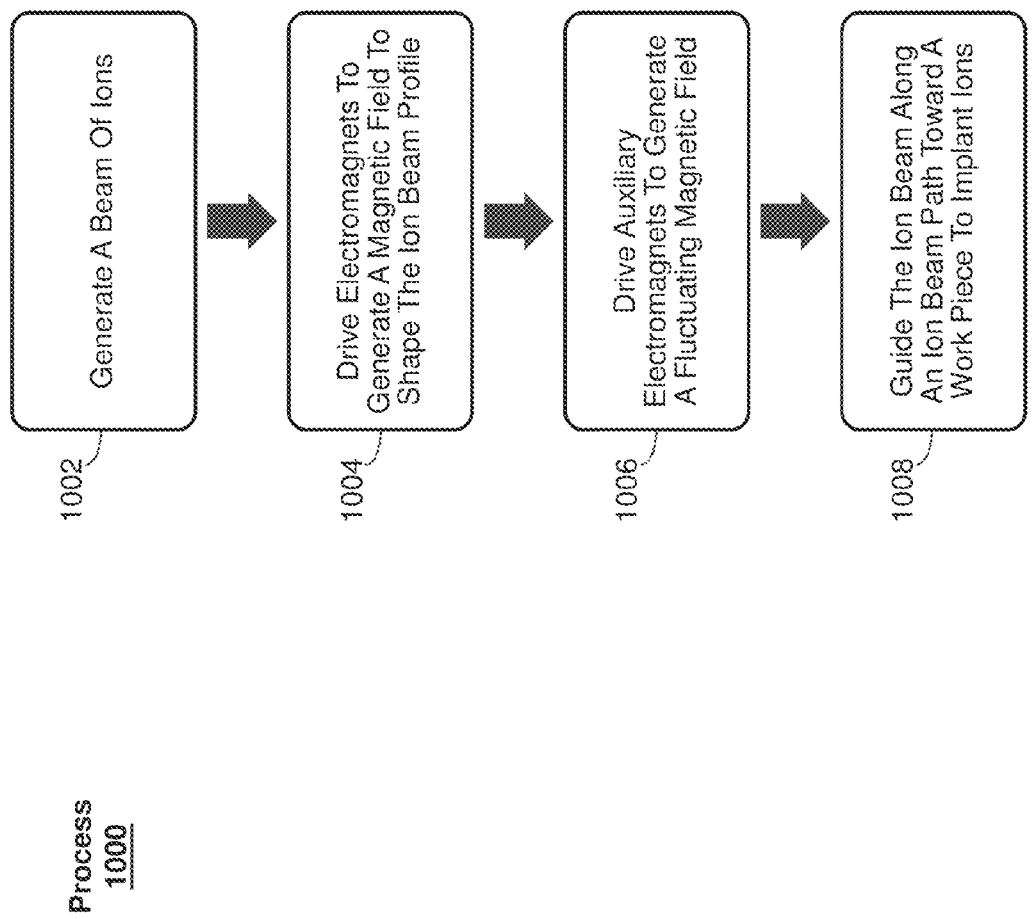

MAGNETIC FIELD FLUCTUATION FOR BEAM SMOOTHING

CROSS-REFERENCE TO RELATED APPLICATIONS

This application claims priority to U.S. Provisional Application No. 61/757,068 filed with the U.S. Patent and Trademark Office on Jan. 25, 2013, the entire contents of which are hereby incorporated by reference.

BACKGROUND

1. Field

The present disclosure relates generally to dopant implantation of a work piece and, more specifically, to smoothing a time-averaged ion implantation beam profile by subjecting the beam to a fluctuating magnetic field.

2. Related Art

Dopant implantation, such as ion implantation, is a process used in fabricating integrated semiconductor devices whereby conductivity-altering impurities, such as ions, are introduced into a work piece, such as a silicon wafer, a semiconductor plate, a glass plate, or the like. An ion implanter or ion implantation tool may include an ion source to generate the impurity material and a mass analyzer to form an ion implant beam with ions of a specific mass-to-charge ratio. Other components of an ion implanter may include accelerators, decelerators, magnetic field devices, electrical field devices, beam current measurement systems, and scan systems. Among these components, magnetic field devices (e.g., magnetic multipoles) may be integral for manipulating the beam to achieve a certain profile for required dose uniformity on the work piece. For example, a spot beam may require a beam profile shaped like a Gaussian curve (i.e., the concentration of ions may be highest in the center, and the ion concentration may fall off quickly as the distance from the center increases).

However, in the example of a spot beam, the desired Gaussian curve-shaped beam profile may not always be readily achievable due to the limitations of beam tuning, and specifically the difficulties of removing noise, spikes, peaks, shoulders, and the like from a beam profile (i.e., correcting ion beam portions with ion concentration that is too high or too low). In addition, obtaining the desired beam profile may come at the expense of sacrificing beam current or increasing beam tuning time, which may result in an overall decrease in productivity. Accordingly, smoothing an ion implantation beam profile is desired without sacrificing beam current and without sacrificing productivity from increased beam tuning time.

BRIEF SUMMARY

In one exemplary embodiment, a method for implanting ions in a work piece may use an ion implantation tool having an ion beam source, a mass analyzing magnet, a plurality of separately driven electromagnets, and one or more separately driven auxiliary electromagnets. The method may include generating a beam of ions with the ion beam source. The method may further include driving the plurality of separately driven electromagnets to generate a magnetic field to shape an ion beam profile of the ion beam and driving the one or more separately driven auxiliary electromagnets with a periodic signal to generate a fluctuating magnetic field. The fluctuating magnetic field may cause the ion beam profile shape to change continuously to smooth a time-averaged ion beam profile of the ion beam. The method may also include guiding the ion beam along an ion beam path toward a work piece using the mass analyzing magnet to implant ions on the work piece.

The method may further include driving a set of multipole magnets to collimate the ion beam. The plurality of electromagnets and the one or more auxiliary electromagnets may be positioned on the ion beam path before the set of mulitpole magnets. The one or more auxiliary electromagnets may be positioned outside a height and a width of the ion beam. Four auxiliary electromagnets may be used, with each positioned on each end of a pair of multipole magnets, and a set of the plurality of electromagnets may also be positioned on each of the pair of multipole magnets. The ion implantation tool may further include a controller to drive the plurality of electromagnets with direct current (DC) signals to generate a quadrupole magnetic field for adjusting the ion beam profile and to drive the auxiliary electromagnets with periodic signals to generate the fluctuating magnetic field for smoothing the ion beam profile. The fluctuating magnetic field may be strongest near the center of the ion beam and may become weaker with distance from the center of the ion beam.

BRIEF DESCRIPTION OF THE DRAWINGS

FIG. 4 illustrates an exemplary scanning system.

FIGS. 5A and 5B illustrate a portion of an exemplary multipole magnet for smoothing a time-averaged beam profile by subjecting it to a fluctuating magnetic field.

FIG. 10 illustrates an exemplary process for doping a work piece.

DETAILED DESCRIPTION

Figure 1:
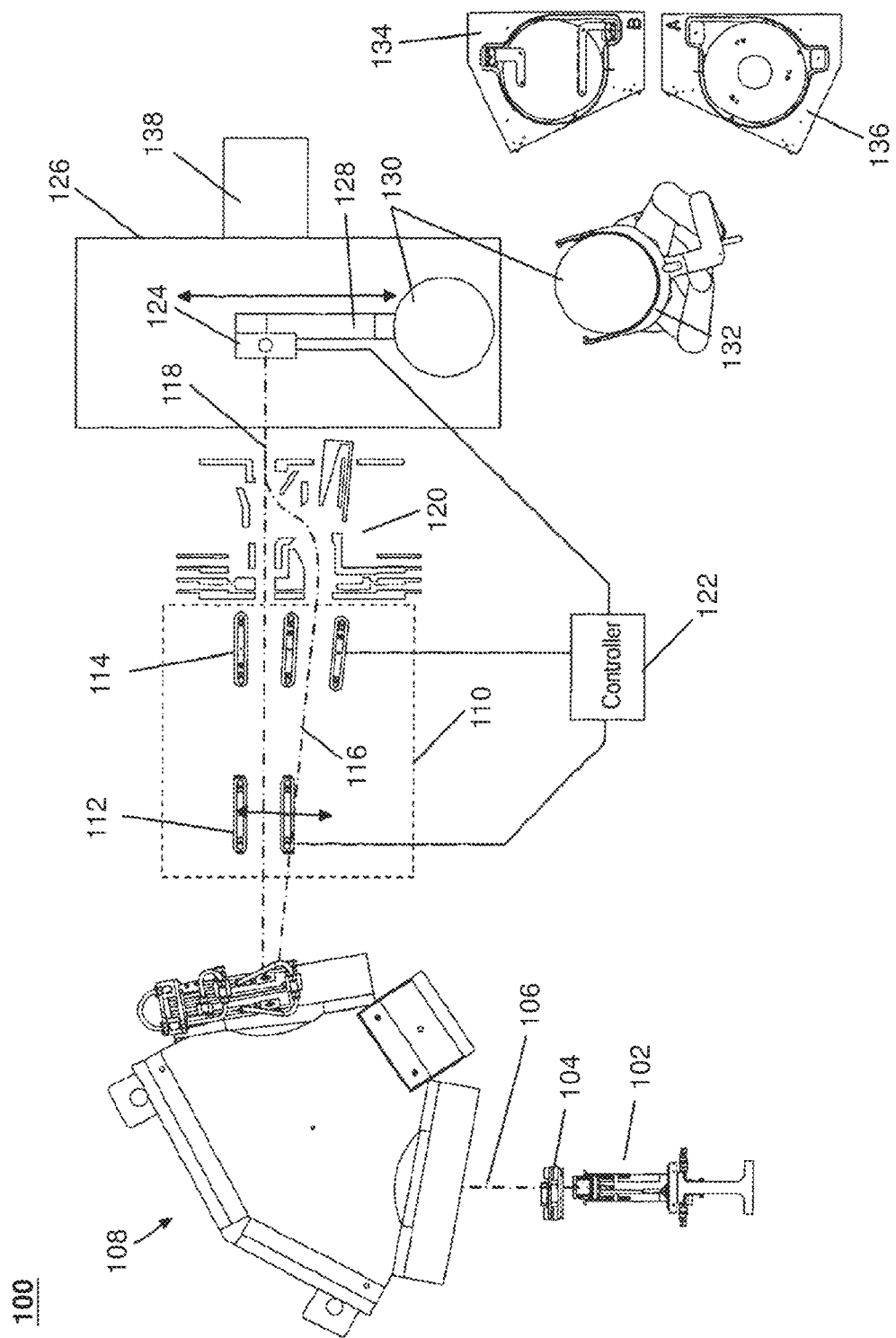
FIG. 1 illustrates an exemplary ion implantation system incorporating multipole magnets for shaping an ion beam.

The following description is presented to enable a person of ordinary skill in the art to make and use the various embodiments. Descriptions of specific systems, devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Ion implantation may be used to introduce ions into a work piece, such as a silicon wafer, in fabricating integrated semiconductor devices. As integrated circuits shrink in size while also improving in speed and functionality, the tolerances for doping variations in silicon wafers are decreasing. Likewise, as the market for the millions of devices incorporating integrated circuits becomes even more competitive, high device yields in fabrication are increasingly required to improve profits. To accommodate tighter tolerances and higher required yields, increased demands are being placed on ion implantation tools. In particular, ion implantation tools more and more must provide work piece doping that is substantially uniform across a work piece, to thereby yield the highest number possible of quality integrated circuits.

However, achieving substantially uniform doping across a work piece presents unique challenges due to noise, spikes, peaks, shoulders, and the like that may be present in ion implantation beam profiles (i.e., beam current density profiles). To address these challenges, ion implantation tools may be carefully tuned prior to implanting to ensure a high quality implantation beam profile. However, precision tuning can take a significant amount of time, thereby decreasing implantation throughput while wasting implantation tool resources and energy. Similarly, the unwanted effects of noise and the like may be reduced by increasing the number of times a work piece is scanned with an ion beam, decreasing the distance between adjacent scans (e.g., decreasing the step size from 30 mm to 24 mm or 18 mm), and/or lowering the current of an ion beam. However, each of these approaches may also increase the amount of time it takes to complete doping of a work piece, thereby again decreasing implantation throughput while wasting implantation tool resources and energy.

Thus, various embodiments are described below relating to one or more auxiliary magnetic field devices that improve a time-averaged beam profile by smoothing out noise, spikes, peaks, shoulders, and the like over time. In one embodiment, auxiliary magnetic field devices, such as electromagnets, may smooth a time-averaged ion beam profile by subjecting the ion beam to a fluctuating magnetic field to continuously change (or in some cases to randomize) the instantaneous ion beam profile. The auxiliary electromagnets may be configured such that the fluctuating magnetic field primarily affects ions near the center of the beam where the highest concentration of ions is positioned. For example, the auxiliary electromagnets may be configured to primarily impact ions located at positions corresponding to the peak of a Gaussian curve-shaped spot beam profile (i.e., ions where ion concentration is highest). By affecting primarily the beam center with a fluctuating magnetic field, the position of ions near the center and the instantaneous beam profile may be continuously varied over time, such that the time-averaged beam profile is smoothed to reduce noise, spikes, and the like.

A smoother time-averaged beam profile may increase dosage uniformity across a work piece and thereby increase work piece yield. A smoother beam profile may also allow for higher ion beam currents to be used for implantation without significantly decreasing overall work piece dosage uniformity. Moreover, as various embodiments described herein may smooth the ion beam profile, tuning requirements may be relaxed, and the time it takes to tune an ion beam may be reduced, thereby saving time and energy while also increasing implantation throughput. Accordingly, various embodiments described herein may beneficially save time and energy while smoothing an ion beam profile to provide improved work piece doping uniformity, work piece yield, implantation throughput, and the like.

In one embodiment, to smooth an ion beam profile, an ion implantation tool may be provided with one or more auxiliary electromagnets located anywhere along or on either side of an ion beam path (between an ion source and a target, such as a silicon wafer). The one or more auxiliary electromagnets (e.g., coils of wire wrapped around a core) may be driven by periodic signals (e.g., alternating current (AC) signals shaped as sine waves, triangle waves, etc. that may be shifted relative to a ground) during operation when beam profile smoothing is desired. For example, the auxiliary electromagnets may be driven with high frequency signals anywhere from 50 to 300 Hz or higher. It should be noted that the frequency and amplitude of the signals may be adjusted depending on a particular implementation to achieve the desired magnetic field strength. In other examples, a fluctuating signal may be used that may not be strictly periodic (e.g., a randomized signal or other signal that varies over time).

The auxiliary electromagnets may preferably be positioned outside the width and/or height of an ion beam so as not to interfere with other beam modifying components (e.g., components for shaping, tuning, directing, or otherwise modifying the beam). When driven by a periodic signal, the auxiliary electromagnets may generate a fluctuating magnetic field that may be strongest near the center of an ion beam. The fluctuating magnetic field may cause the instantaneous beam profile shape to continuously change over time. For example, at a first instant in time, the beam may have a profile shape with a high concentration of ions in a first position. At a second instant in time, the fluctuating magnetic field may cause the beam to have a different beam profile shape with a high concentration of ions in a second position. In some examples, varied beam profile shapes may have high ion concentrations positioned up to 20 mm from the center of the time-averaged beam profile. In addition, the fluctuating magnetic field may cause variations (which may be random) in other portions of the beam profile shape other than portions with high ion concentrations. By continuously varying the beam profile shape with the fluctuating magnetic field, noise, spikes, peaks, or the like that may be present in a single instantaneous beam profile may be averaged out over time from other beam profile shapes with fewer or different spikes, peaks, noise, and the like that may be in different positions. The continuously varying beam profile shapes may thus produce a smooth time-averaged beam profile shape.

Referring first to FIG. 1, an exemplary ion implantation system 100 may incorporate auxiliary multipole magnets, such as the outermost electromagnets of multipole magnets 112, for smoothing an ion beam profile. Ion implantation system 100 may include ion source 102, extraction optics 104, mass analyzing magnet 108, focusing system 110, controller 122, target chamber 126, and wafer transport system 132 (e.g., robot arm 132). System 100 may also include a combination of beam dumps and electrodes 120 for absorbing unwanted ions and further shaping and guiding the ion beam, and Faraday beam profile measurement system 124 located in target chamber 126 for measuring an ion beam profile. System 100 may further include beam dump 138 (which may also be a Faraday measuring device or other ion absorbing element) for absorbing ions that are not absorbed or otherwise intercepted before reaching the termination of beam path 118. One of ordinary skill in the art will recognize that many or all of the components of system 100 may be housed in a vacuum enclosure (not shown).

Ion source 102 may include, for example, a Bernas or a Freeman ion source. Ion source 102 may generate desired ion species from electron ionization of a source gas. For example, for semiconductor device fabrication, the desired ion species may include boron, phosphorus, or arsenic (e.g., B+, P+, and As+). Ion source 102 and extraction optics 104 may generate ion beam 106. Extraction optics 104 may include at least one extraction electrode. An extraction voltage may be applied to the at least one extraction electrode to extract ions from ion source 102 to generate ion beam 106. For example, extraction optics 104 may extract either positive ion species or negative ion species by applying a relative negative or relative positive extraction voltage, respectively, to the at least one extraction electrode. The current and energy of ion beam 106 may also be modified, at least in part, based on the applied extraction voltage.

Ion beam 106 may be directed into mass analyzing magnet 108, which may apply a magnetic field such that only the ions in ion beam 106 having a desired mass-to-charge ratio may pass through mass analyzing magnet 108 toward the target. Mass analyzing magnet 108 may be configured to direct the emerging ions on one of two paths: either along beam path 118 providing a substantially straight path toward target chamber 126, or along beam path 116 providing a deceleration chicane (e.g., an s-bend) for modifying the ion beam energy and current before remerging onto path 118 toward target chamber 126. One of ordinary skill in the art will recognize that other electrodes, other electromagnets, and still other components not shown or described here may be used to guide an ion beam as desired for a particular embodiment (e.g., guide an ion beam along beam path 116 and back onto path 118).

Focusing system 110 may include one or more magnets, multipole magnets, or sets of multipole magnets for focusing and otherwise controlling the ion beam. FIG. 1 illustrates a first set of multipole magnets 112 as well as a second set of multipole magnets 114. In one embodiment, multipole magnets 112 may be movable along a track (as indicated by arrows) to be positioned either for straight beam path 118 or for deceleration beam path 116. In one embodiment, multipole magnets 112 may control the size and current density of the ion beam. In doing so, multipole magnets 112 may be configured to adjust the shape of the beam as well as the spatial uniformity. In one embodiment, multipole magnets 112 may be configured with auxiliary electromagnets to improve a beam profile by smoothing out noise, spikes, peaks, shoulders, and the like over time. The auxiliary electromagnets of multipole magnets 112 may smooth an ion beam profile by subjecting the ion beam to a fluctuating magnetic field that causes the beam profile shape to be changed continuously to average out noise that may be present in any instantaneous beam profile. In some examples, the auxiliary electromagnets may primarily affect the center of the beam where the highest concentration of ions is positioned. For example, the auxiliary electromagnets of multipole magnets 112 may be configured to primarily impact ions in a position corresponding to the peak of a Gaussian curve-shaped spot beam profile.

Multipole magnets 112 may include electromagnets comprising electrically-excitable wire coils orthogonally wrapped around a magnetic core, each individual coil being separately excitable. In some embodiments, the core may be laminated to reduce eddy currents. In other embodiments, multipole magnets 112 may include coils wrapped around a non-magnetic core, or may include coils without a core. Other variations of multipole magnets 112 are also possible, and various embodiments are described in further detail below.

Focusing system 110 may also include multipole magnets 114. As illustrated in FIG. 1, in one embodiment, system 100 and focusing system 110 may include multipole magnets 114 for both straight beam path 118 and deceleration beam path 116. Multipole magnets 114 may thus comprise two sets of multipole magnets, three multipole magnets, or other combinations for allowing control of an ion beam along either straight beam path 118 or deceleration beam path 116. In still other embodiments, multipole magnets 114 may be movable on a track to be positioned for use on either beam path. Multipole magnets 114 may be of a similar construction as multipole magnets 112 (i.e., electromagnets comprising individually excitable wire coils).

Multipole magnets 114 may generate a quadrupole field that is suitable for collimation of an ion beam to cancel divergence or convergence before the ions are implanted in a work piece in target chamber 126. Multipole magnets 114 may, for example, cancel divergence or convergence introduced by multipole magnets 112 (e.g., halting beam spread, halting beam narrowing, etc.). In some embodiments, multipole magnets 114 may also allow for steering of a beam to strike the surface of a work piece in a particular location, or to allow for other positional adjustments of the beam. In still other embodiments, multipole magnets 114 may be configured to repeatedly deflect the ion beam to scan a work piece that may be stationary or moving.

Target chamber 126 is illustrated with Faraday beam profile measurement system 124, scan arm 128, and work piece 130. In one embodiment, Faraday beam profile measurement system 124 may include multiple tools that may be moved into the beam path to measure various characteristics of an ion beam. For example, system 124 may include tools (e.g., Faraday cups) to measure ion beam current, ion beam energy, ion beam shape, ion beam uniformity, ion beam noise, ion beam angle, and the like. Each measurement tool of system 124 may be automatically positioned in line with straight beam path 118, in turn, when measurements are desired (e.g., during beam tuning, between scans, between work pieces, for testing, etc.), and may be automatically moved out of the beam path when not needed.

Scan arm 128 may be configured to position a work piece, such as work piece 130, in front of the ion beam. In some embodiments, scan arm 128 may be configured to pivot back and forth (as illustrated by arrows) to pass the work piece through the beam, while its height is progressively increased or decreased, so as to scan the work piece through the ion beam in a curved zigzag pattern (e.g., scanning along an arc and stepping the height up or down between scans, increasing or decreasing the height while scanning along an arc, etc.). Scan arm 128 may also be configured to rotate the work piece. In other embodiments, the ion beam may be moved (e.g., the ion beam may be deflected side to side or up and down) to repeatedly scan a stationary work piece, or a combination of ion beam movement and work piece movement may be used to scan the work piece with the ion beam (e.g., the ion beam may be deflected while the work piece is moved).

Ion implantation system 100 may also include various components for holding and transporting work pieces. In one embodiment, work pieces may be stacked before and after implantation in load locks or load ports 134 and 136. Robot arm 132 may retrieve work pieces to be doped from either load port 134 or load port 136, and similarly return doped work pieces. Robot arm 132 may transfer work pieces to be doped (e.g., work piece 130) to scan arm 128 for ion implantation. After implantation, robot arm 132 may retrieve a doped work piece from scan arm 128 and store it in either load port 134 or load port 136.

Controller 122 may be configured to interact with and control multipole magnets 112, multipole magnets 114, Faraday beam profile measurement system 124, and/or other elements of system 100. In some embodiments, separate controllers may be used for separate elements, each controller communicating with a server, host controller, overall system controller, or the like. Controller 122 may control beam measuring, receive ion beam characteristics from Faraday beam profile measurement system 124, and modify the ion beam by altering drive signals of multipole magnets 112 and 114 (including auxiliary electromagnets for smoothing the ion beam profile). Controller 122 may separately drive each individual coil of multipole magnets 112 and 114 with specific currents to cause a particular magnetic field to be generated to modify the ion beam characteristics as desired. Controller 122 may also control other components of ion implantation system 100 as well as receive feedback from various system components and instructions from users.

Controller 122 may include a computing system including, for example, a processor, memory, storage, and input/output devices (e.g., monitor, keyboard, disk drive, Internet connection, etc.). Controller 122 may also include circuitry or other specialized hardware for controlling and interacting with various system elements. In some operational settings, controller 122 may be configured as a system that includes one or more units, each of which is configured to carry out some functions of controller 122 in software, hardware, or some combination thereof.

Controller 122 may include a computing system with a motherboard having an input/output ("I/O") section, one or more central processing units ("CPU"), and a memory section, which may have a flash memory card or various other types of memory related to it. The I/O section may be connected to a display, a keyboard, a disk storage unit, a media drive, and the like. An exemplary media drive can, for example, read/write a computer-readable storage medium, which can contain programs or other data for executing the functions of controller 122, among other things.

In some embodiments, data received by controller 122 and values computed by controller 122 can be saved for subsequent use (e.g., for future scans, for research, for records, etc.). Additionally, a computer-readable medium can be used to store (e.g., tangibly embody) one or more computer programs for performing functions of controller 122. Such computer programs may be written, for example, in a general purpose programming language (e.g., Pascal, C, C++) or some specialized application-specific language.

Figure 2:
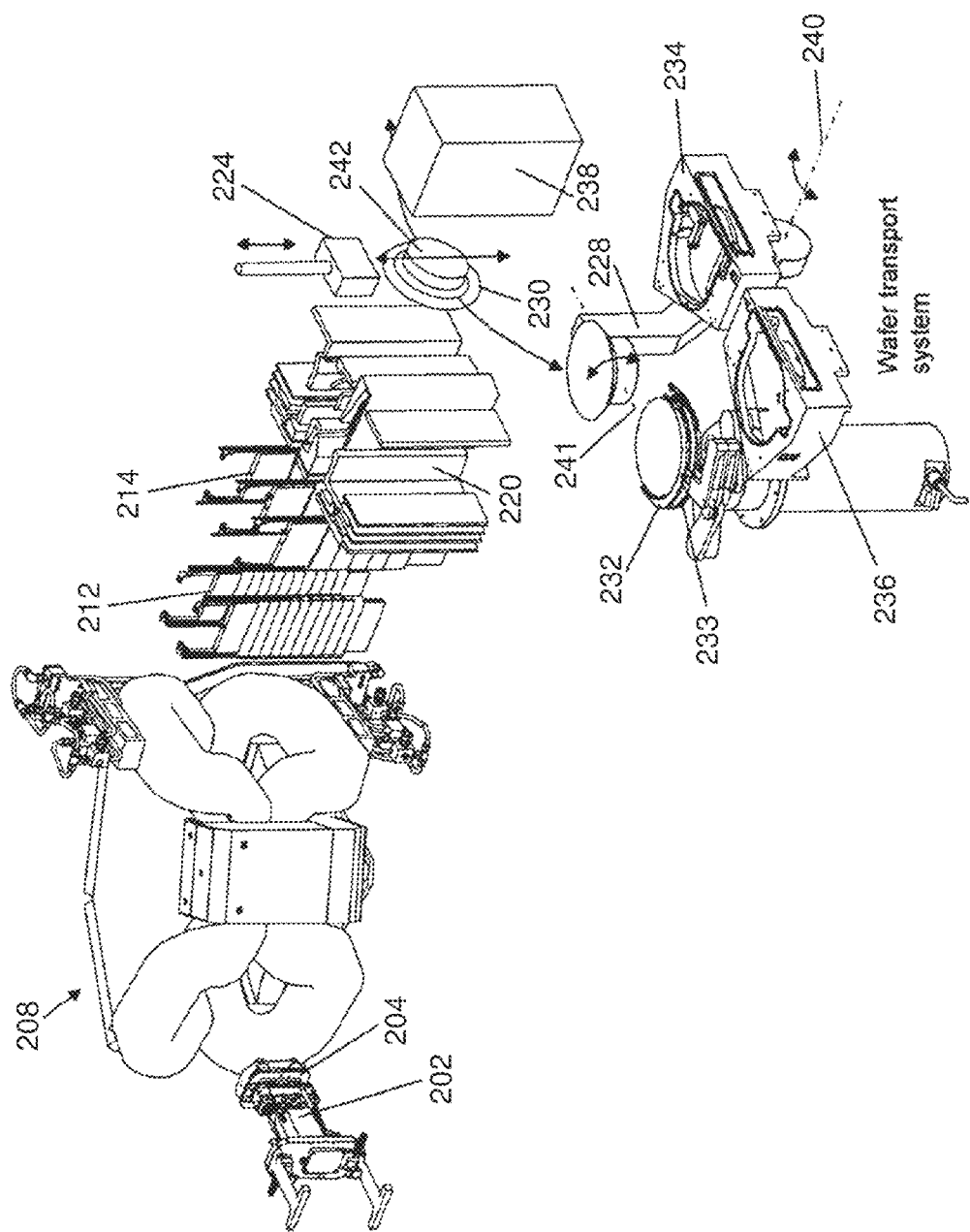
FIG. 2 illustrates a perspective view of an exemplary ion implantation system incorporating multipole magnets for shaping an ion beam.

FIG. 2 illustrates a perspective view of exemplary ion implantation system 200. Ion implantation system 200 may be different than ion implantation system 100, or may be the same as ion implantation system 100; similarly numbered components may also be configured the same and perform the same functions (i.e., multipole magnets 212 may be the same as multipole magnets 112), or they may differ. Ion implantation system 200 may include ion source 202, extraction optics 204, and mass analyzing magnet 208. Ions generated by ion source 202, extracted by extraction optics 204, and passed through mass analyzing magnet 208 may form an ion beam that is significantly larger in one dimension than another (i.e., tall and narrow). System 200 may include a first set of multipole magnets 212 (which may include auxiliary electromagnets for smoothing a beam profile), a second set of multipole magnets 214, a combination of beam dumps and electrodes 220 for absorbing unwanted ions and further shaping and guiding the ion beam, and Faraday beam profile measurement system 224 for measuring an ion beam profile. System 200 may further include beam dump 238 (which may also be a Faraday measuring device or other ion absorbing element) for absorbing ions that are not absorbed or otherwise intercepted before reaching the termination of the ion implantation beam path.

Multipole magnets 212 may control the size and current density of the ion beam. In doing so, multipole magnets 212 may be configured to adjust the shape of the beam as well as the spatial uniformity. Multipole magnets 212 may include auxiliary electromagnets at the upper and lower extremes that may be configured to improve a beam profile by smoothing out noise, spikes, peaks, shoulders, and the like over time. The auxiliary electromagnets of multipole magnets 212 may smooth an ion beam profile by subjecting the ion beam to a fluctuating magnetic field that causes the beam profile shape to be changed continuously to average out noise that may be present in any instantaneous beam profile. In some examples, the auxiliary electromagnets may primarily affect the center of the beam profile where the highest concentration of ions is positioned. For example, the auxiliary electromagnets of multipole magnets 212 may be configured to primarily impact ions in a position corresponding to the peak of a Gaussian curve-shaped spot beam profile.

Multipole magnets 212 may include several electromagnets comprising electrically-excitable wire coils orthogonally wrapped around a laminated magnetic core, each individual coil being separately excitable. As illustrated in FIG. 2, multipole magnets 212 may include two multipole magnets that may straddle a tall, narrow ion beam. A tall, rectangular core may be wrapped with several individual coils, stacked vertically, each of which may be separately excitable or controllable to generate a quadrupole magnetic field with particular desired characteristics to adjust portions or all of an ion beam as desired. As with system 100, multipole magnets 212 may be movable to straddle either an ion beam on a straight path to the target or an ion beam deflected along a deceleration chicane path. The auxiliary electromagnets of multipole magnets 212 may be positioned at the upper and lower extremes of multipole magnets 212, which in some embodiments may be outside the height and width of the ion beam.

Multipole magnets 214 may be provided for both a straight ion beam path and a deceleration ion beam path. Multipole magnets 214 may thus comprise two sets of multipole magnets, three multipole magnets, or other combinations for allowing control of an ion beam along either path. In still other embodiments, multipole magnets 214 may be movable on a track to be positioned for use on either beam path. Multipole magnets 214 may be of a similar construction as multipole magnets 212 (i.e., electromagnets comprising individually excitable wire coils wrapped around a tall core and stacked vertically).

Multipole magnets 214 may generate a quadrupole field that is suitable for collimation of an ion beam to cancel divergence or convergence before the ions are implanted in a target work piece. Multipole magnets 214 may, for example, cancel divergence or convergence introduced by multipole magnets 212 (e.g., halting beam spread, halting beam narrowing, etc.). Multipole magnets 214 may also suspend ion convergence or divergence caused by a fluctuating magnetic field generated by the auxiliary electromagnets of multipole magnets 212. In some embodiments, multipole magnets 214 may also allow for steering of a beam to strike the surface of a work piece in a particular location, or to allow for other positional adjustments of the beam. In still other embodiments, multipole magnets 214 may be configured to repeatedly deflect the ion beam to scan a work piece that may be stationary or moving.

System 200 is further illustrated with Faraday beam profile measurement system 224, scan arm 228, and work piece 230. In one embodiment, Faraday beam profile measurement system 224 may include multiple tools that may be moved into the beam path (as illustrated by arrows) to measure various characteristics of an ion beam. For example, system 224 may include tools (e.g., Faraday cups) to measure ion beam current, ion beam energy, ion beam shape, ion beam uniformity, ion beam noise, ion beam angle, and the like. Each measurement tool of system 224 may be automatically positioned in line with the beam path, in turn, when measurements are desired (e.g., during beam tuning, between scans, between work pieces, for testing, etc.), and may be automatically moved out of the beam path when not needed.

Scan arm 228 may include an electrostatic chuck 242 for positioning a work piece, such as work piece 230, in front of the ion beam. Scan arm 228 may be configured to pivot back and forth around axis 240 (as illustrated by curved arrows) to pass the work piece through the beam, while its height is progressively increased or decreased (as illustrated by vertical arrows), so as to scan the work piece through the ion beam (e.g., in a curved zigzag pattern by scanning along an arc and stepping the height up or down between scans, increasing or decreasing the height while scanning along an arc, etc.). Scan arm 228 may also be configured to rotate a work piece around axis 241 to position the work piece at the desired angle for doping (as illustrated by curved arrows). In other embodiments, the ion beam may be moved (e.g., the ion beam may be deflected side to side or up and down) to repeatedly scan a stationary work piece, or a combination of ion beam movement and work piece movement may be used to scan the work piece with the ion beam (e.g., the ion beam may be deflected while the work piece is moved).

Ion implantation system 200 may also include various components for holding and transporting work pieces. In one embodiment, work pieces may be stacked before and after implantation in load locks or load ports 234 and 236. Robot arm 232 may include an electrostatic chuck 233 or similar work piece grasping component to retrieve work pieces to be doped from either load port 234 or load port 236, and similarly return doped work pieces. Robot arm 232 may transfer work pieces to be doped (e.g., work piece 230) to scan arm 228 with electrostatic chuck 242 for ion implantation. After implantation, robot arm 232 may retrieve a doped work piece from scan arm 228 and store it in either load port 234 or load port 236.

Figure 3:
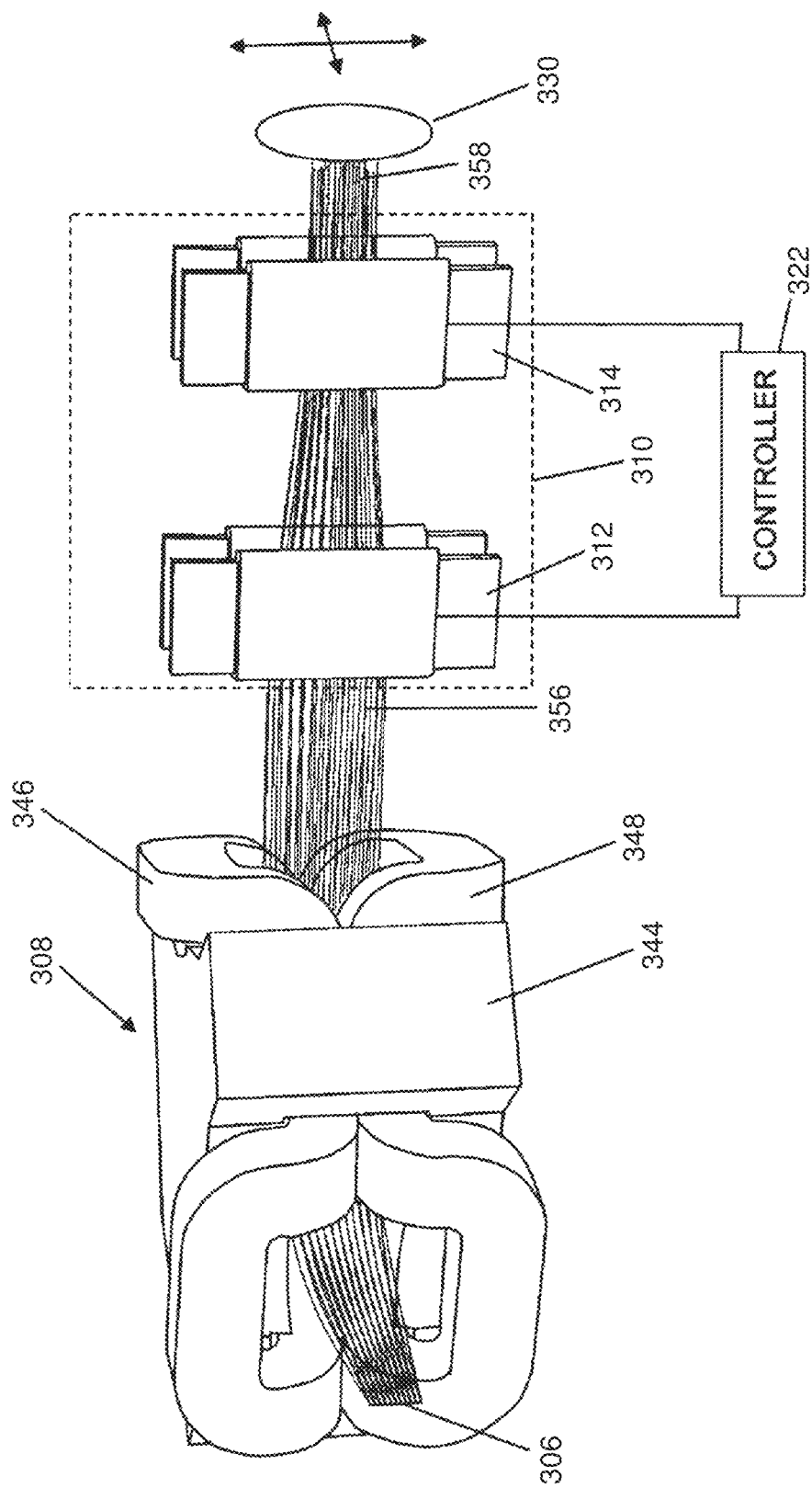
FIG. 3 illustrates exemplary multipole magnets generating a spot beam having a Gaussian curve-shaped beam profile.

FIG. 3 illustrates focusing system 310 with multipole magnets 312 and 314 generating spot beam 358 that may have a Gaussian curve-shaped beam profile for implanting a target, such as work piece 330. The components shown in FIG. 3 may be the same as similarly numbered components in system 100 of FIG. 1 or system 200 of FIG. 2 (i.e., multipole magnets 312 may be the same as multipole magnets 112 and 212). Mass analyzing magnet 308 may receive ion beam 306, which may be generated from an ion source and extraction optics. Mass analyzing magnet 308 may include arcuate yoke 344 of ferromagnetic material and upper and lower coils 346 and 348. Yoke 344 and coils 346 and 348 may generate an ion beam pathway that is curvilinear. Coils 346 and 348 may be saddle-shaped (or bedstead-shaped) and may be mirror images of one another. Current passing through coils 346 and 348 may generate a magnetic field that bends and filters ion beam 306 to exit as tall and narrow ion beam 356, rejecting contaminants, and passing toward the target only those ions with the desired mass-to-charge ratio. Mass analyzing magnet 308 may also be configured to deflect the exiting ion beam at multiple angles for different ion beam paths (e.g., straight beam path 118 or deceleration beam path 116 of FIG. 1). Multipole magnets 312 and 314 may be duplicated for the various ion beam paths, or they may be movable to be positioned along any of the various ion beam paths.

Multipole magnets 312 may be the same as multipole magnets 212 and 112 of FIGS. 2 and 1, respectively, and may include auxiliary electromagnets at the upper and lower extremes for smoothing an ion beam profile. As illustrated, multipole magnets 312 may straddle ion beam 356 exiting mass analyzing magnet 308. Multipole magnets 312 may adjust the spatial uniformity, size, and shape of an ion beam. For example, as illustrated, multipole magnets 312 may deflect ions from ion beam 356 to converge into a vertically smaller ion beam. In shaping the beam profile, multipole magnets 312 may adjust the spatial uniformity to obtain the desired concentration of ions (e.g., a Gaussian curve-shaped beam profile for a spot beam). As discussed in further detail below, the auxiliary electromagnets of multipole magnets 312 may also subject at least the center portion of ion beam 356 to a fluctuating magnetic field to smooth the beam profile to reduce noise, peaks, and the like.

Multipole magnets 314 may be the same as multipole magnets 214 and 114 of FIGS. 2 and 1, respectively. As illustrated, multipole magnets 314 may collimate an ion beam—substantially cancelling the convergence or divergence of ions such that the ions in ion beam 358 may strike target surface 330 at a substantially uniform angle. Multipole magnets 314 may also be configured to steer ion beam 358 to strike target surface 330 at a particular position. Controller 322 may be the same as controller 122 of system 100 in FIG. 1, and may control multipole magnets 312 and 314, exciting the various coils with various currents to produce the desired ion beam profile. Work piece 330 may be moved relative to ion beam 358 to scan the work piece with ions and provide a substantially uniform doping. As illustrated by arrows, work piece 330 may be moved in at least two dimensions, and may also be rotated as desired. In one embodiment, work piece 330 may be supported by a scan arm that pivots the work piece back and forth sideways, in and out of the beam, while progressively moving vertically, to scan the entire work piece surface in a curved zigzag pattern (e.g., scanning along an arc and stepping the height up or down between scans, increasing or decreasing the height while scanning along an arc, etc.).

FIG. 4 illustrates exemplary scanning system 400 for scanning work piece 430 through ion beam 458 (as mentioned above, however, the ion beam may be moved to scan the work piece, or a combination of ion beam movement and work piece movement may be used). Scanning system 400 may be part of either system 100 or system 200 of FIGS. 1 and 2, respectively. Scanning system 400 may include scan arm 428 that rotates about axis 440 to pivot work piece 430 in and out of ion beam 458. Scan arm 428 may include electrostatic chuck 442 for handling work piece 430. Scan arm 428 may also be configured to move vertically along sliding seal 460 to uniformly dope work piece 430 with successive scans through ion beam 458 (e.g., in a curved zigzag pattern by scanning along an arc and stepping the height up or down between scans, increasing or decreasing the height while scanning along an arc, etc.). Sliding seal 460 may provide a sealed juncture between a vacuum sealed housing of an ion implantation tool and the outside atmosphere. Scan arm 428 may also be configured to rotate work piece 430 about axis 441 to position work piece 430 at a desired angle for implantation. Scan arm 428 and electrostatic chuck 442 may further be able to rotate work piece 430 within its own plane (e.g., rotate 90 degrees between scans). Scanning system 400 is also illustrated with beam dump 438 (which may also be a Faraday measuring device or other ion absorbing element) for absorbing ions that are not absorbed or otherwise intercepted before reaching the termination of the beam path of ion beam 458.

Additional details will now be described of various embodiments of auxiliary multipole magnets for smoothing an ion beam profile. It should be appreciated that multipole magnets 112 and 114 of FIG. 1, multipole magnets 212 and 214 of FIG. 2, and multipole magnets 312 and 314 of FIG. 3 may all incorporate some or all of the features described herein of exemplary auxiliary multipole magnets for generating a magnetic field to obtain a desired ion beam profile. However, in one embodiment, the exemplary configurations described below may be incorporated primarily in multipole magnets 112 of FIG. 1, multipole magnets 212 of FIG. 2, and multipole magnets 312 of FIG. 3. In addition, while various embodiments of magnets for smoothing an ion beam profile have been described as auxiliary, it should be appreciated that a fluctuating magnetic field function for smoothing may be incorporated into any of the magnetic field devices described herein without providing separate auxiliary wire coils (i.e., any coils of any magnetic field devices discussed herein may be driven with a periodic or other changing signal to produce a fluctuating magnetic field that may help smooth an ion beam profile).

FIGS. 5A and 5B illustrate a portion of an exemplary multipole magnet, including auxiliary electromagnets for smoothing a beam profile of an ion beam by subjecting the ion beam to a fluctuating magnetic field. FIG. 5A illustrates a laminated yoke or core 570 around which are 17 orthogonally-wrapped individual wire coils—each forming an electromagnet that may be excited individually (e.g., by controller 122). In one embodiment, all 17 coils may be identical or substantially the same in construction. In other embodiments, outermost coils 572 and 574 may be of a different construction than coil 576 and the other 14 interior coils (e.g., varying in number of windings, wire gauge, material, etc.). In still other embodiments, a variety of coil constructions may be included at different positions. Individual coils may comprise wire (e.g., magnet wire) wrapped multiple times around core 570 and electrically connected to a current source, such as controller 122 outputting a drive signal.

Although FIG. 5A illustrates a multipole magnet that includes laminated core 570, it should be appreciated that a multipole magnet suitable for smoothing an ion beam profile as described herein may not include a core, may include a laminated core (e.g., magnetic electrical steel M-19), may include a solid—non-laminated—core (e.g., solid magnetic steel 1006), may include separate cores for separate coils, or may comprise different electromagnet constructions known to those of ordinary skill in the art. A typical core, if one is used, may comprise a material with high electrical resistivity and magnetic permeability to reduce eddy currents while increasing the amplitude of the generated magnetic field. Because eddy currents generated in the core of an electromagnet may themselves generate magnetic fields that interfere with the desired magnetic field, a laminated core may be used to minimize eddy currents and accordingly reduce interference with the desired magnetic field. Thus, for embodiments with low eddy currents, a solid core may be suitable, whereas for embodiments with potentially high eddy currents, a laminated core may be desired to avoid significant interference with the desired magnetic field. Similarly, a core may be either magnetic or non-magnetic depending on the desired magnitude of the magnetic field to be generated by the multipole magnet, and the shape may likewise vary based on needs. For example, while laminated core 570 is illustrated as having a rectangular shape, other core shapes may be used (e.g., 'E,' shaped cores, curved cores, columnar cores, etc.).

Figure 6C:
FIGS. 6A, 6B, and 6C illustrate exemplary laminated cores for magnetic field devices.
Figure 6B:
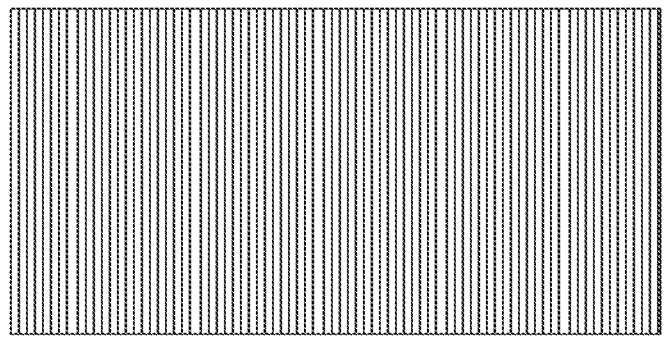
Figure 6A:
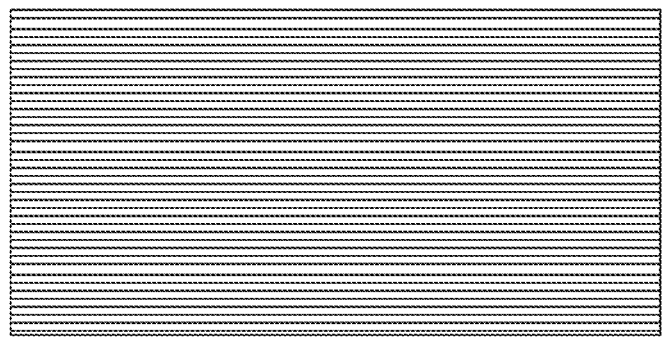

FIGS. 6A, 6B, and 6C illustrate various laminated core configurations that may be used in any of the multipole magnets described herein. From the perspective shown, FIG. 6A illustrates a laminated core with a vertical construction, FIG. 6B illustrates a laminated core with a horizontal construction, and FIG. 6C illustrates a laminated core with a stacked plate construction. In each of these exemplary constructions, adjacent plates or core portions may be narrow (e.g., 0.635 mm thick, 2.75 mm thick, 6 mm thick, etc.), may be made of magnetic or non-magnetic materials (e.g., magnetic electrical steel M-19, stainless steel, aluminum, etc.), and may be electrically insulated (e.g., with epoxy) such that current flow is limited or prevented between adjacent plates or core portions. As such, a laminated core may be used to prevent eddy currents from developing that may produce magnetic fields that could interfere with the desired magnetic field of the multipole magnet.

Referring again to FIGS. 5A and 5B, the number of coils and layout of the coils may be varied based on needs. For example, a single coil may be used to generate a fluctuating magnetic field to smooth an ion beam profile. In other embodiments, 17 coils may be used collectively to both smooth a beam profile and provide spatial uniformity. Fewer coils or more coils may be used depending on the desired resulting magnetic field and the size of the ion beam to be affected. Rather than stacked vertically close together, coils may be spaced apart, arranged in different shapes, or otherwise varied to obtain a multipole magnet capable of generating the desired magnetic field. Incorporating multiple coils may provide the capability to drive or power different coils with different drive signals, such as periodic signals, direct current (DC) signals, a combination of periodic and DC signals, or other signal variations (e.g., energy, amplitude, frequency, current, etc.) depending on magnetic field needs.

In one embodiment, the multipole magnet of FIG. 5A may be either one of the set of multipole magnets 212 of system 200 in FIG. 2, and may thus operate on a vertically-aligned ion beam that is tall and narrow. Outermost coils 572 and 574, positioned at the upper and lower extremes of the illustrated multipole magnet, may be auxiliary electromagnets operable to smooth an ion beam profile. In one embodiment, coils 572 and 574 may be positioned outside the vertical position and height of the vertically-aligned ion beam (e.g., on opposite sides of the ion beam), while coil 576 and some or all of the other 14 interior coils may be positioned within or mostly within the vertical position and height of the vertically-aligned ion beam. Coil 576 and the other 14 interior coils may be driven individually with particular DC signals, causing them to generate a mostly static quadrupole magnetic field that may be used to control the size and current density of an ion beam. For example, the interior coils may be configured to adjust the shape of the beam (e.g., deflecting ions to narrow the beam vertically to a spot beam as illustrated in FIG. 3) and to adjust the spatial uniformity of the beam (e.g., deflecting ions to produce a spot beam with a Gaussian curve-shaped beam profile with the highest ion concentration in the center of the beam). As illustrated by multipole magnets 212 in FIG. 2, a set of multipole magnets may straddle an ion beam, so the multipole magnet of FIG. 5A may be duplicated, and each of those coils may be similarly driven with individual signals to generate the desired magnetic field.

Coils 572 and 574 may be individually driven with periodic signals during operation when beam profile smoothing is desired. For example, coils 572 and 574 may be driven with high frequency signals anywhere from 50 to 300 Hz or higher. In one embodiment, coil 572 may be driven with a periodic signal that is different than coil 574 (e.g., opposite, shifted, different amplitude, different frequency, etc.). In another embodiment, coils 572 and 574 may be driven with the same periodic signal. Using the opposite drive signal (or the same drive signal as the case may be) may cause each of coils 572 and 574 to impact ions in the center of the ion beam in the same (or at least a similar) way. For example, at one point in time, the magnetic fields generated by both coil 572 and coil 574 may slightly deflect ions at the center of the beam downward; at another time, both fields may slightly deflect ions at the center of the beam upward.

In still other embodiments, coils 572 and 574 may be used to shape the ion beam as well as smooth the ion beam profile by being driven with a signal that has a DC component as well as a periodic component. In addition, coil 576 and any other interior coil may be used not only to shape the ion beam, but also to generate a fluctuating magnetic field to help smooth the ion beam profile, or any interior coil may be used only to smooth the ion beam profile with a fluctuating magnetic field. For example, some or all of the interior coils may be driven with a signal that has both a DC component and a periodic component, or some or all of the interior coils may be driven with only a periodic signal. Thus, depending on the desired magnetic field and the desired changes in the beam profile, different coils may be driven with different signals that may be DC signals, periodic signals, or signals with both DC and periodic components.

Moreover, the position of the ion beam relative to the various coils depicted in FIG. 5A may be different than what has been described. For example, any of the coils, including any of the interior coils, may be outside the height of the ion beam (i.e., outside the upper or lower edge of the ion beam) or within the height of the ion beam (i.e., within the upper and lower edges of the ion beam). It should be noted that the height of the ion beam may correspond to the vertical span of the ion beam with significant ion concentration (ignoring stray ions or areas with negligible ion concentration), and the upper and lower edges may correspond approximately to where the ion concentration drops to zero or to a relatively negligible level. Similarly, for a horizontally-aligned ion beam, the width may correspond to the horizontal span of the ion beam with significant ion concentration, with ion concentration dropping to zero or to a relatively negligible level at the edges.

The fluctuating magnetic field may be strongest near the center of the ion beam, and may affect the instantaneous beam profile shape most significantly near the center of the ion beam (e.g., the peak of a Gaussian curve-shaped spot beam profile). For example, the fluctuating magnetic field may cause instantaneous beam profile shapes to be generated with high ion concentrations that range as much as 20 mm from the center of the ion beam. In addition, the fluctuating magnetic field may cause variations (which may be random) in other portions of the beam profile shape other than portions with high ion concentrations. Curve 573 may illustrate an example of the magnetic field strength B (or magnetic flux density B) of the fluctuating magnetic field along the height of the multipole magnet of FIG. 5A at one moment in time. As illustrated, the fluctuating magnetic field may be strongest near the center of the multipole magnet, and the field may be substantially weaker near the upper and lower ends of the multipole magnet. By continuously varying the beam profile shape with the fluctuating magnetic field, noise, spikes, peaks, or the like that may be present in a single instantaneous beam profile may be averaged out over time from other beam profile shapes with fewer or different spikes, peaks, noise, and the like that may be in different positions. The continuously varying beam profile shapes may thus produce a smooth time-averaged beam profile shape.

As mentioned above, a duplicate set of multipole magnets may straddle an ion beam, so a total of four auxiliary electromagnets may be used, each generating a fluctuating magnetic field, which may combine to generate a quadrupole magnetic field. In one embodiment, all four auxiliary electromagnets may generate a magnetic field that affects ions at the center of the ion beam in the same or substantially the same way (which, depending on the orientation of coils and other known factors, may require driving auxiliary electromagnets on opposite sides of the ion beam with opposite signals, driving adjacent auxiliary electromagnets with opposite signals, or other configurations). Positioning coils 572 and 574 outside the height of the ion beam (or outside the edges of the ion beam) may beneficially reduce or eliminate unwanted interference with the shaping/uniformity magnetic field discussed above. In particular, positioning coils 572 and 574 outside the height of the ion beam (and in some embodiments on opposite sides of the ion beam) may beneficially reduce or prevent fluctuations at the top and bottom of the ion beam while the generated fluctuating magnetic field primarily impacts the center of the ion beam, thereby retaining control for providing uniform doping on a work piece with a time-averaged smooth beam profile.

FIG. 5B illustrates a multipole magnet where the coils may have been encased in a potting compound such as epoxy, resin, or another compound, or may have been encased in a housing. Such housings may produce eddy currents that could interfere with the desired magnetic field depending on the construction, so housing materials may preferably be non-magnetic while also having high electrical resistivity, being laminated, or being solid with a reduced thickness to minimize eddy currents. Outermost coils 582 and 584 may correspond to coils 572 and 574 of FIG. 5A, while coil 586 and the other 14 interior coils may correspond to coil 576 and the other interior coils of FIG. 5A. Although coils 582 and 584 are shown with a distinct pattern from the interior coils, coils 582 and 584 may be identical or substantially the same as the interior coils, and/or may have the same potting compound or housing.

Figure 7A:
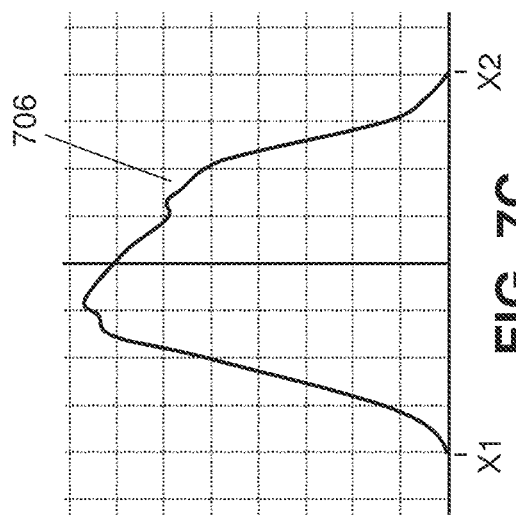
FIGS. 7A, 7B, and 7C illustrate exemplary instantaneous beam profiles generated from a fluctuating magnetic field.
Figure 7B:
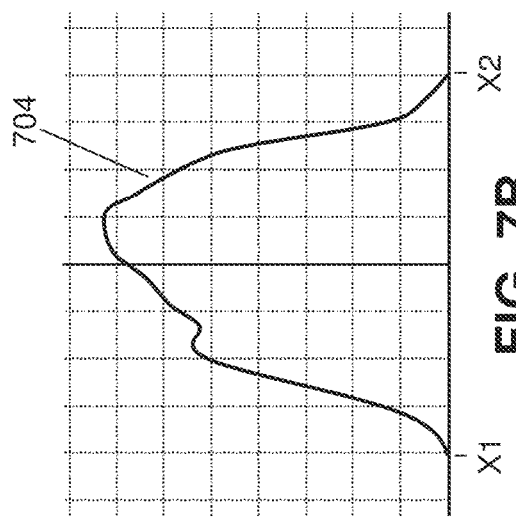
Figure 7C:
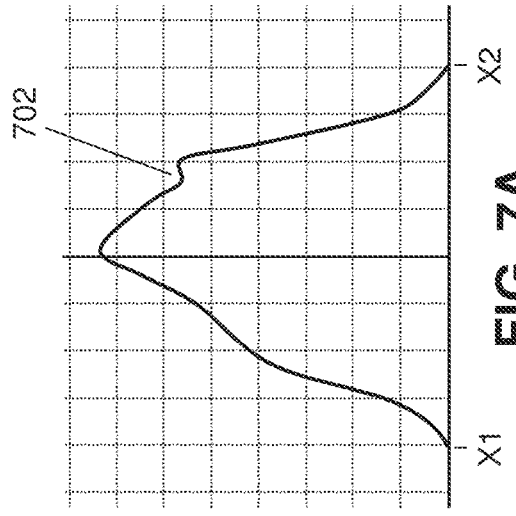

FIGS. 7A, 7B, and 7C illustrate exemplary theoretical instantaneous beam profiles 702, 704, and 706 that may result from subjecting an ion beam to a fluctuating magnetic field from auxiliary electromagnets discussed herein. While typical beam profile measurement equipment may provide a time-averaged beam profile measurement, theoretical instantaneous beam profiles 702, 704, and 706 are provided for illustrative purposes and may regardless represent actual instantaneous beam profiles with varied ion concentration. Beam profiles 702, 704, and 706 may represent instantaneous samplings of a vertically-aligned spot beam at three different times; the horizontal axes ('x' axes) of FIGS. 7A, 7B, and 7C may be vertical position, and the vertical axes ('y' axes) of FIGS. 7A, 7B, and 7C may be ion concentration, ion energy, ion current, or the like. Position X1 may correspond to the bottom edge of the ion beam, and position X2 may correspond to the top edge of the ion beam. The height of the corresponding ion beam may thus be the distance between position X1 and position X2.

Beam profiles 702, 704, and 706 may illustrate the continuously changing beam profile shape of an ion beam—over time—effectuated by a fluctuating magnetic field generated by any of the auxiliary electromagnets discussed herein. Beam profile 702 may represent a theoretical instantaneous measurement of an ion beam at a first time t0, beam profile 704 may represent a theoretical instantaneous measurement of the same ion beam at a later time t1, and beam profile 706 may represent a theoretical instantaneous measurement of the same ion beam at a later time t2. It should be noted that the difference in time between times t0, t1, and t2 may be very short (e.g., milliseconds, microseconds, nanoseconds, picoseconds, or even shorter). As illustrated, the instantaneous beam profile shape may change from profile 702 at time t0 with a peak near the center of the ion beam to different profile 704 at time t1 with a peak to the right of center (or above center). The beam profile may then change to still different profile 706 at time t2 with a peak to the left of center (or below center). After time t2, the fluctuating magnetic field may cause the beam profile to continue to change to any of a practically infinite number of instantaneous beam profile shapes that—collectively and over time—average out noise, spikes, peaks, and the like.

In one embodiment with a Gaussian curve-shaped spot beam (vertically or horizontally aligned), ions near the center of the ion beam may be affected by the fluctuating magnetic field more than ions near the edges of the ion beam, thereby generating instantaneous beam profile shapes with more significant variations near the center than near the edges. One of ordinary skill in the art will appreciate that the illustrated profiles are for descriptive purposes, and the actual instantaneous beam profile shapes may be different than what is shown depending on the implementation.

Notably, despite the marked profile shape variations near the center of the ion beam, the edges of the ion beam profiles may remain unchanged as illustrated by positions X1 and X2 in each of FIGS. 7A, 7B, and 7C. In particular, instantaneous beam profiles 702, 704, and 706 may all share the same ion beam edges and have the same height (or width), from ion beam lower edge X1 to ion beam upper edge X2, even though the centers of the beam profiles vary. The time-averaged beam profile (which may be that illustrated in FIG. 8B, as discussed below) may likewise share the same ion beam edges and have the same height (or width) as some or all of the instantaneous beam profiles, even though the center of the profiles vary. As discussed above, positioning auxiliary electromagnets outside the width and/or height of an ion beam may reduce or eliminate variations at the edges of the ion beam while still continuously changing the instantaneous beam profile shape, with variations that may be most significant near the center of the beam. By maintaining consistent beam height or width and beam edge positions, a user may beneficially have more precise control over implantation and may be able to better predict how different implantation settings (e.g., different scan patterns, different scan velocities, different beam currents, etc.) will perform in implanting a work piece.

Figure 8A:
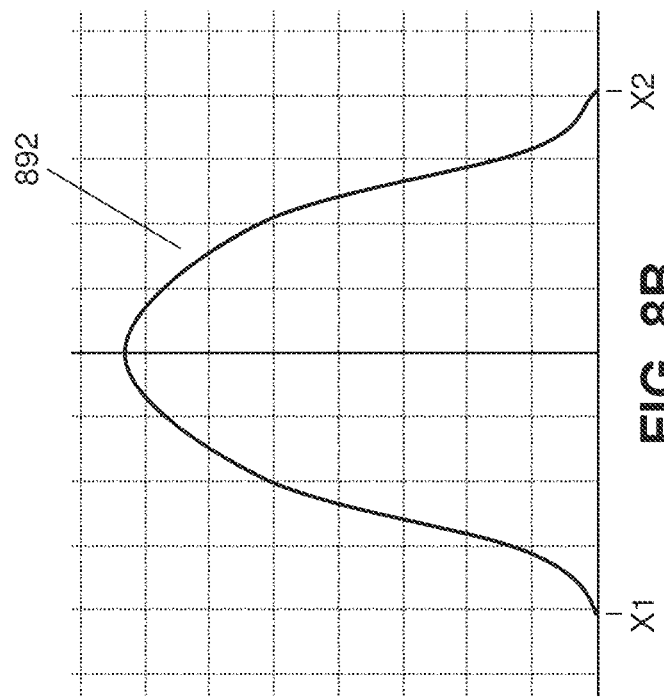
FIGS. 8A and 8B illustrate exemplary time-averaged beam profiles without magnetic field fluctuation for beam smoothing and with magnetic field fluctuation for beam smoothing, respectively.

FIG. 8A illustrates exemplary time-averaged beam profile 890 that may be a measured beam profile of any of the implantation systems described herein. Beam profile 890 may be a time-averaged beam profile of an ion beam that was not subject to a fluctuating magnetic field from auxiliary electromagnets for smoothing described herein. In one embodiment, beam profile 890 may represent a vertical, time-averaged sampling of a vertically-aligned spot beam; the horizontal axis ('x' axis) of FIG. 8A may be vertical position, and the vertical axis ('y' axis) of FIG. 8A may be ion concentration, ion energy, ion current, or the like. Position X1 may correspond to the bottom edge of the ion beam, and position X2 may correspond to the top edge of the ion beam. The height of the corresponding ion beam may thus be the distance between position X1 and position X2.

Beam profile 890 may be a Gaussian curve-shaped spot beam profile, with the highest concentration of ions in the center of the beam. Beam profile 890 may illustrate a Gaussian curve-shaped beam profile that suffers from noise, spikes, peaks, shoulders, and the like. In some instances, ion implantation with an ion beam with a profile like beam profile 890 may produce poor quality, non-uniform, or otherwise unsatisfactory work piece doping. In other instances, a beam with a beam profile like beam profile 890 may require additional tuning time to attempt to eliminate some of the noise, spikes, peaks, shoulders, etc. In still other instances, a work piece may require a significantly higher number of scans, a decreased distance between adjacent scans, or a lowered beam current with a beam profile like beam profile 890, in an attempt to apply uniform doping across the work piece.

Figure 8B:
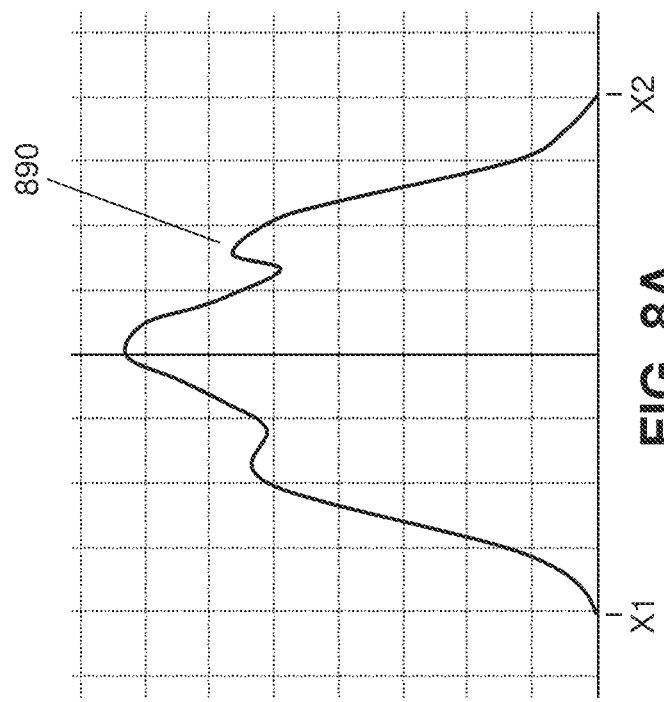

FIG. 8B illustrates exemplary time-averaged beam profile 892 that may be a measured beam profile of any of the implantation systems described herein. Beam profile 892 may be a time-averaged beam profile of an ion beam that was subject to a fluctuating magnetic field from auxiliary electromagnets for smoothing described herein. As with beam profile 890, beam profile 892 may represent a vertical, time-averaged sampling of a vertically-aligned spot beam; the horizontal axis ('x' axis) of FIG. 8B may likewise be vertical position, and the vertical axis ('y' axis) of FIG. 8B may be ion concentration, ion energy, ion current, or the like. As in FIG. 8A, position X1 of FIG. 8B may correspond to the bottom edge of the ion beam, and position X2 may correspond to the top edge of the ion beam.

Beam profile 892 may be a Gaussian curve-shaped spot beam profile, with the highest concentration of ions in the center of the beam. Beam profile 892 may illustrate a Gaussian curve-shaped beam profile where the corresponding spot beam has been smoothed by being subjected to a fluctuating magnetic field by any of the auxiliary electromagnets described herein to cause the instantaneous beam profile to change continuously to average out noise, spikes, peaks, shoulders, and the like. Beam profile 892 may, for example, illustrate the time-averaged beam profile shape of beam profiles 702, 704, and 706 of FIGS. 7A, 7B, and 7C, respectively. As illustrated, beam profile 892 is smoother than beam profile 890 and more closely follows a desirable Gaussian curve shape, which may be the result of auxiliary electromagnets smoothing the beam to remove or reduce the impact of noise, spikes, peaks, shoulders, and the like.

In one embodiment, applying a fluctuating magnetic field to an ion beam as discussed herein may transform noisy beam profile 890 into smoother beam profile 892. Notably, position X1 and position X2 may be the same in the corresponding ion beams of FIG. 8A and FIG. 8B despite applying magnetic field fluctuation and causing the instantaneous beam profile to change continuously to smooth the beam. In particular, the bottom edge of the ion beam may remain in the same vertical position X1, and the top edge of the ion beam may remain in the same vertical position X2, while the center portion of the beam profile is changed. Likewise, the height of the ion beam may be unchanged, the distance between vertical position X1 and vertical position X2 being the same in the corresponding ion beams of FIG. 8A and FIG. 8B. As discussed above, positioning auxiliary electromagnets outside the width and/or height of an ion beam may reduce or eliminate variations at the edges of the ion beam while beneficially changing the beam profile shape most significantly near the center of the ion beam to produce a time-averaged smooth beam profile as illustrated in FIG. 8B.

Figure 9C:
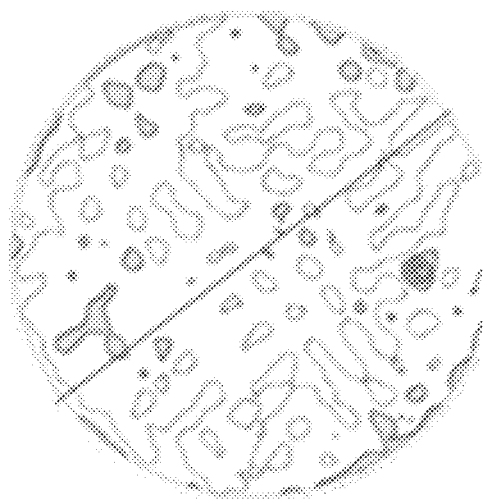
FIGS. 9A, 9B, and 9C illustrate dose uniformity of exemplary work pieces doped with 160 beam scans without magnetic field fluctuation, 80 beam scans without magnetic field fluctuation, and 80 beam scans with magnetic field fluctuation, respectively.
Figure 9B:
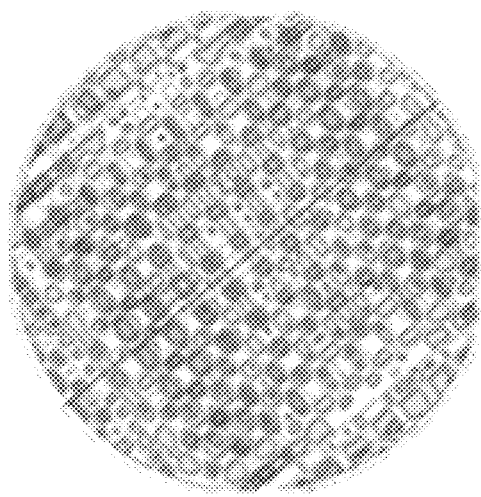
Figure 9A:
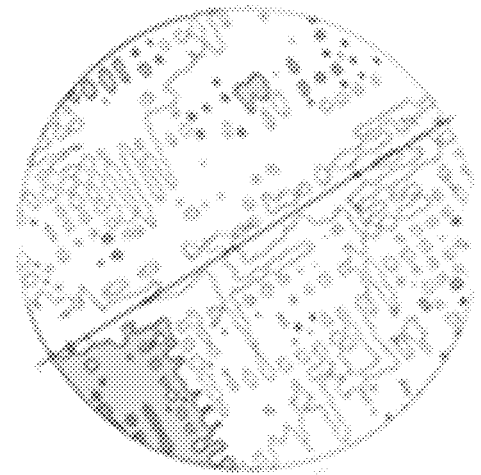

FIGS. 9A, 9B, and 9C illustrate dose uniformity of exemplary work pieces doped using different implantation settings. Shading variations in FIGS. 9A, 9B, and 9C may illustrate undesirable dosage non-uniformity across a work piece. FIG. 9A may correspond to a work piece doped without subjecting the ion beam to a fluctuating magnetic field from any of the auxiliary electromagnets discussed herein. As mentioned above, ion beam noise, spikes, and the like may lead to non-uniform dosage across a work piece. One method of addressing ion beam noise to improve uniformity may be to increase the number of times a work piece is scanned through an ion beam. For example, FIG. 9A may correspond to a work piece scanned 160 times through an ion beam (e.g., by rotating the work piece 90 degrees between sets of 40 vertically progressing scans). As shading variations in FIG. 9A are relatively minor, the work piece implantation corresponding to FIG. 9A may be relatively uniform with relatively minor dosage variations. However, scanning the work piece 160 times may have required significantly more implantation time than scanning other work pieces fewer times, so achieving the uniformity illustrated in FIG. 9A may have come at the expense of decreased work piece implantation throughput.

FIG. 9B may correspond to another work piece doped without subjecting the ion beam to a fluctuating magnetic field from any of the auxiliary electromagnets discussed herein. FIG. 9B may correspond to a work piece scanned 80 times through an ion beam (e.g., by rotating the work piece 90 degrees between sets of 20 vertically progressing scans). With half the number of scans as the work piece of FIG. 9A, implantation of the work piece of FIG. 9B may have been completed significantly faster, which may have increased work piece implantation throughput. As illustrated by shading variations, however, the work piece implantation corresponding to FIG. 9B may be markedly less uniform with significantly more dosage variations than the work piece of FIG. 9A. Thus, while halving the number of scans may have reduced implantation time and increased throughput, the improvement may have come at the expense of decreased dosage uniformity on the work piece, which may also have decreased yield.

In contrast, FIG. 9C may correspond to a work piece doped with an ion beam with a smoothed ion beam profile from subjecting the ion beam to a fluctuating magnetic field from any of the auxiliary electromagnets discussed herein. FIG. 9C may correspond to a work piece scanned 80 times through an ion beam like the work piece corresponding to FIG. 9B, but with the addition of subjecting the ion beam to a fluctuating magnetic field to cause the instantaneous beam profile to change continuously to smooth the beam profile. As illustrated by the relatively minor shading variations, the work piece implantation corresponding to FIG. 9C may be much more uniform with relatively minor dosage variations compared to the work piece of FIG. 9B that was scanned the same number of times. Thus, without increasing the number of scans and decreasing implantation throughput, dosage uniformity may be significantly increased by smoothing the beam profile by subjecting the ion beam to a fluctuating magnetic field from any of the auxiliary electromagnets discussed herein.

In addition, the uniformity of the work piece of FIG. 9C may be nearly the same as or better than the uniformity of the work piece of FIG. 9A that was scanned twice as many times. Thus, the uniformity improvement gained from subjecting the ion beam to a fluctuating magnetic field may be nearly the same as or better than the uniformity improvement gained from doubling the number of scans, but may be achieved without the expense of decreased throughput associated with the increased number of scans. Accordingly, as illustrated by FIGS. 9A, 9B, and 9C, smoothing an ion beam profile by subjecting the ion beam to a fluctuating magnetic field using any of the auxiliary electromagnets discussed herein may significantly improve work piece dosage uniformity without the added costs of other approaches.

FIG. 10 illustrates exemplary process 1000 for doping a work piece. Process 1000 may begin at block 1002 by generating a beam of ions. A beam of ions may be generated, for example, from an ion source and extraction optics, such as ion source 102 and extraction optics 104 of system 100 or ion source 202 and extraction optics 204 of system 200. At block 1004, electromagnets may be driven to generate a magnetic field to shape the ion beam profile (i.e., beam current density profile). In one embodiment, a pair of multipole magnets straddling the ion beam may be used that comprise stacked, separately driven wire coils orthogonally wrapped around a core, which may be laminated. For example, any of multipole magnets 112, 212, and 312 may be used with any of the laminated cores illustrated in FIGS. 6A, 6B, and 6C. Each of the coils may be driven with a particular DC drive signal to generate a quadrupole magnetic field to cause ions to converge or diverge to form the desired beam profile. In other embodiments, some or all of the coils may be drive with periodic signals or with signals that have both a DC component and a periodic component. Each of the pair of multipole magnets may include several individual electromagnets to allow control of individual portions of the ion beam (e.g., 5 electromagnets, 10 electromagnets, 15 electromagnets, etc.). The magnetic field may cause a spot beam to be generated with a Gaussian curve-shaped beam profile with the highest concentration of ions in the center of the beam.

At block 1006, auxiliary electromagnets may be driven to generate a fluctuating magnetic field to cause the ion beam profile shape to change continuously to smooth the time-averaged beam profile. In one embodiment, the fluctuating magnetic field may be separate from the magnetic field of block 1004. In another embodiment, however, the fluctuating magnetic field may be combined with the magnetic field of block 1004 along the same portion of the ion beam path. The fluctuating magnetic field may be generated by one or more individually-excitable auxiliary electromagnets that may or may not be wrapped around a laminated core. In one embodiment, the one or more auxiliary electromagnets may be stacked with and wrapped around the same core as the coils used to generate the magnetic field of block 1004. For example, the auxiliary electromagnets may be part of multipole magnets 112, 212, or 312, and may be arranged as illustrated in FIGS. 5A and 5B. The one or more auxiliary electromagnets may be positioned outside the width and height of the ion beam, and may be configured to primarily impact the center of the ion beam while limiting interference with the upper and lower edges of the ion beam. In other embodiments, the auxiliary magnets may be positioned within the width or height of the ion beam.

The one or more auxiliary electromagnets may be driven with periodic drive signals. In other embodiments, the one or more auxiliary electromagnets may be driven with DC signals or signals that have both a DC component and a periodic component. One, two, four, or more auxiliary electromagnets may be used to generate a fluctuating magnetic field to cause the instantaneous beam profile to change continuously to smooth the time-averaged ion beam profile. For example, four auxiliary electromagnets may be used, which may be positioned on the ends of a set of multipole magnets (i.e., each electromagnet positioned on an end of each of a set of multipole magnets), or may be positioned outside of one of the upper or lower corners of the ion beam (i.e. outside both the width and height of the ion beam, outside the edges of the ion beam, on opposite sides of the ion beam, etc.). The fluctuating magnetic field may cause the instantaneous beam profile to change continuously to average out noise, spikes, and the like such that the time-averaged beam profile is smooth.

At block 1008, the ion beam may be guided along an ion beam path toward a work piece to implant ions on the work piece. In one embodiment, a mass analyzing magnet may be used both to filter the generated ions to pass only those ions with the desired mass-to-charge ratio and to deflect the generated ion beam along a particular path. For example, any of mass analyzing magnets 108, 208, and 308 discussed above may be used. In some embodiments, the mass analyzing magnet may be positioned in the tool between the ion beam source and the electromagnets of blocks 1004 and 1006. The ion beam may be taller than it is wide. In some embodiments, before being implanted, the ion beam may be subjected to a magnetic field other than those of blocks 1004 and 1006 to collimate the shaped and smoothed ion beam. A pair of multipole magnets similar to those of block 1004 may be used to generate a quadrupole magnetic field to collimate the ion beam. For example, multipole magnets 114, 214, or 314 may be used. The magnetic field may cancel divergence or convergence of the ions such that the ions in the ion beam may emerge from the field and strike a target at a substantially uniform angle. Spreading or narrowing of the beam may thus be halted before implantation. The collimating multipole magnets may also be used to deflect the ion beam to strike a target at a particular position.

The shaped and smoothed (and in some cases collimated) ion beam may be implanted into a target work piece, such as work piece 130, 230, 330, or 430. A target work piece may be scanned multiple times through the ion beam, in vertically-progressing scans until the entire work piece has been doped. The work piece may then be rotated (e.g., 90 degrees), and it may be scanned through the ion beam again in vertically-progressing scans. Rotation and scanning may be repeated as needed to ensure uniform doping of the work piece (e.g., one more time, two more times, etc.). In other embodiments, the ion beam may be moved (e.g., the ion beam may be deflected side to side or up and down) to repeatedly scan a stationary work piece, or a combination of ion beam movement and work piece movement may be used to scan the work piece with the ion beam (e.g., the ion beam may be deflected while the work piece is moved). Process 1000 may thus produce a doped work piece with a substantially uniform ion dosage across the work piece.

While specific components, configurations, features, and functions are provided above, it will be appreciated by one of ordinary skill in the art that other variations may be used. Additionally, although a feature may appear to be described in connection with a particular embodiment, one skilled in the art would recognize that various features of the described embodiments may be combined. Moreover, aspects described in connection with an embodiment may stand alone.

Although embodiments have been fully described with reference to the accompanying drawings, it should be noted that various changes and modifications will be apparent to those skilled in the art. Such changes and modifications are to be understood as being included within the scope of the various embodiments as defined by the appended claims.

What is claimed is:

1. A method for implanting ions in a work piece using an ion implantation tool, the ion implantation tool having an ion source, a mass analyzing magnet, a plurality of separately driven electromagnets, and one or more separately driven auxiliary electromagnets, the method comprising:
    generating an ion beam with the ion source, wherein a cross-section of the ion beam has a long dimension that extends from a first edge of the ion beam to a second edge of the ion beam;
    driving the plurality of separately driven electromagnets to generate a magnetic field to shape an ion beam profile of the ion beam;
    driving the one or more separately driven auxiliary electromagnets with a periodic signal to generate a fluctuating magnetic field, wherein:
        the periodic signal comprises an alternating current signal;
        the fluctuating magnetic field causes the ion beam profile shape to change continuously to smooth a time-averaged ion beam profile of the ion beam; and
        a position of the first edge of the ion beam and a position of the second edge of the ion beam are not altered by the fluctuating magnetic field; and
    guiding the ion beam along an ion beam path toward a work piece using the mass analyzing magnet to implant ions on the work piece.

2. The method of claim 1, further comprising:
    driving a set of multipole magnets to collimate the ion beam;
    wherein the plurality of electromagnets and the one or more auxiliary electromagnets are positioned on the ion beam path between the mass analyzing magnet and the set of multipole magnets.

3. The method of claim 1, wherein the one or more auxiliary electromagnets are positioned outside of the first edge of the ion beam and the second edge of the ion beam.

4. The method of claim 1, wherein the one or more auxiliary electromagnets comprise at least two auxiliary electromagnets, wherein at least one of the at least two auxiliary electromagnets is positioned on an opposite side of the ion beam from at least one other of the at least two auxiliary electromagnets.

5. The method of claim 1, wherein the one or more auxiliary electromagnets comprise at least four auxiliary electromagnets, wherein at least one of the at least four auxiliary electromagnets is positioned on each end of a pair of multipole magnets, and wherein a set of the plurality of electromagnets is positioned on each of the pair of multipole magnets.

6. The method of claim 5, wherein one or more of the plurality of electromagnets is positioned between the first edge and the second edge of the ion beam as the ion beam passed between the pair of multipole magnets.

7. The method of claim 6, wherein the plurality of electromagnets and the at least four auxiliary electromagnets are wrapped around laminated cores.

8. The method of claim 6, wherein each multipole magnet of the pair of multipole magnets comprises a laminated core around which are orthogonally wrapped the set of the plurality of electromagnets and at least two of the at least four auxiliary electromagnets.

9. The method of claim 1, wherein the plurality of electromagnets and the one or more auxiliary electromagnets are driven by a controller;
    wherein the controller is configured to generate:
        a plurality of direct current (DC) drive signals to drive each of the plurality of separately driven electromagnets to generate a quadrupole magnetic field for adjusting the ion beam profile; and
        one or more periodic drive signals to drive the one or more auxiliary electromagnets to generate the fluctuating magnetic field.

10. The method of claim 9, wherein the quadrupole magnetic field causes ions in the ion beam to converge to create a spot beam with a Gaussian curve-shaped ion beam profile.

11. The method of claim 1, wherein the fluctuating magnetic field is strongest near a center of the ion beam.

12. The method of claim 11, wherein the fluctuating magnetic field becomes weaker with distance from the center of the ion beam.

13. A method for implanting ions in a work piece using an ion implantation tool, the ion implantation tool having an ion source and a pair of multipole magnets, the method comprising:
generating an ion beam with the ion source, wherein a cross-section of the ion beam has a long dimension that extends from a first edge of the ion beam to a second edge of the ion beam;
guiding the ion beam between the pair of multipole magnets, the pair of multipole magnets comprising a plurality of separately driven electromagnets, and one or more separately driven auxiliary electromagnets;
driving the plurality of separately driven electromagnets with one or more first current signals to generate a first magnetic field, the first magnetic field modifying a shape of the ion beam;
driving the one or more separately driven auxiliary electromagnets with one or more second current signals to generate a second magnetic field, wherein:
each of the one or more second current signals comprises an alternating current component;
the second magnetic field continuously fluctuates, the second magnetic field causing an ion beam profile shape of the ion beam to change continuously to smooth a time-averaged ion beam profile of the ion beam; and
a position of the first edge of the ion beam and a position of the second edge of the ion beam are not altered by the second magnetic field; and
guiding the ion beam with the smoothed time-averaged ion beam profile onto the work piece to implant ions in the work piece.

14. The method of claim 13, wherein each of the one or more second current signals further comprises a direct current component.

15. The method of claim 14, wherein each of the one or more first current signals comprises a direct current component that is different from the direct current component of each of the one or more second current signals.

16. The method of claim 13, wherein each of the pair of multipole magnets has a first end and a second end opposite to the first end, and wherein an auxiliary electromagnet of the one or more auxiliary electromagnets is disposed at each end of the first end and the second end of each multipole magnet.

17. The method of claim 16, wherein on each multipole magnet, a set of the plurality of electromagnets is positioned between the auxiliary electromagnet at the first end and the auxiliary electromagnet at the second end.

18. The method of claim 16, wherein the second magnetic field is strongest near a center point of each multipole magnet disposed between the first end and the second end of each multipole magnet, and wherein a strength of the second magnetic field decreases with distance from the center point to each of the first end and the second end of each multipole magnet.

19. The method of claim 13, wherein one or more of the plurality of electromagnets is positioned between the first edge and the second edge of the ion beam as the ion beam passed between the pair of multipole magnets.

20. A method for implanting ions in a work piece using an ion implantation tool, the ion implantation tool having an ion source, a plurality of separately driven electromagnets, and one or more separately driven auxiliary electromagnets, the method comprising:
generating an ion beam with the ion source, wherein a cross-section of the ion beam has a long dimension that extends from a first edge of the ion beam to a second edge of the ion beam;
driving the plurality of separately driven electromagnets with a signal to generate a magnetic field to shape an ion beam profile of the ion beam;
driving the one or more separately driven auxiliary electromagnets with a periodic signal to generate a fluctuating magnetic field, wherein:
the periodic signal comprises an alternating current signal;
the fluctuating magnetic field causes the ion beam profile shape to change continuously to smooth a time-averaged ion beam profile of the ion beam; and
a position of the first edge of the ion beam and a position of the second edge of the ion beam are not altered by the fluctuating magnetic field; and
guiding the ion beam with the smoothed time-averaged ion beam profile onto the work piece to implant ions in the work piece, wherein the one or more separately driven auxiliary electromagnets are driven with the periodic signal to generate the fluctuating magnetic field while implanting ions in the work piece.

21. The method of claim 20, wherein the periodic signal has a frequency of at least 50 Hz.

22. The method of claim 20, wherein the periodic signal comprises an alternating current component and a direct current component.

23. The method of claim 22, wherein the signal comprises a direct current signal that is different from the direct current component of the periodic signal.

* * * * *